United States Patent
Ito et al.

(10) Patent No.: US 7,714,033 B2
(45) Date of Patent: May 11, 2010

(54) PHOTOSENSITIVE INSULATING RESIN COMPOSITION, CURED PRODUCT THEREOF AND ELECTRONIC COMPONENT COMPRISING THE SAME

(75) Inventors: Atsushi Ito, Chuo-ku (JP); Hirofumi Goto, Chuo-ku (JP); Hirofumi Sasaki, Chuo-ku (JP); Ryuichi Okuda, Chuo-ku (JP)

(73) Assignee: JSR Corporation, Tokyo (JP)

( * ) Notice: Subject to any disclaimer, the term of this patent is extended or adjusted under 35 U.S.C. 154(b) by 309 days.

(21) Appl. No.: 11/831,258

(22) Filed: Jul. 31, 2007

(65) Prior Publication Data

US 2008/0045621 A1 Feb. 21, 2008

(30) Foreign Application Priority Data

Aug. 21, 2006 (JP) ............................. 2006-224647
Jul. 2, 2007 (JP) ............................. 2007-174454

(51) Int. Cl.
*G03F 7/004* (2006.01)
*C08G 59/68* (2006.01)
*C08G 65/10* (2006.01)

(52) U.S. Cl. .................. 522/63; 522/126; 522/134; 522/146; 522/147; 528/94; 528/104

(58) Field of Classification Search .............. 430/270.1, 430/280.1; 522/63, 134, 146, 147, 126; 528/94, 528/104
See application file for complete search history.

(56) References Cited

U.S. PATENT DOCUMENTS

| | | | |
|---|---|---|---|
| 6,048,666 A | 4/2000 | Niwa et al. | |
| 6,190,833 B1 * | 2/2001 | Shiota et al. | 430/280.1 |
| 6,797,450 B2 * | 9/2004 | Suzuki et al. | 430/166 |
| 6,838,229 B2 * | 1/2005 | Washio et al. | 430/324 |
| 6,994,944 B2 * | 2/2006 | Nishimura et al. | 430/270.1 |
| 7,015,256 B2 * | 3/2006 | Ito et al. | 522/81 |
| 7,063,934 B2 * | 6/2006 | Saito et al. | 430/276.1 |
| 7,214,454 B2 * | 5/2007 | Inomata et al. | 430/18 |
| 2003/0073042 A1 * | 4/2003 | Cernigliaro et al. | 430/321 |
| 2004/0110084 A1 | 6/2004 | Inomata et al. | |
| 2006/0057468 A1 * | 3/2006 | Igawa et al. | 430/5 |
| 2007/0042296 A1 | 2/2007 | Sasaki et al. | |
| 2008/0026321 A1 * | 1/2008 | Misumi | 430/270.1 |
| 2008/0131819 A1 * | 6/2008 | Misumi et al. | 430/322 |

FOREIGN PATENT DOCUMENTS

| | | |
|---|---|---|
| EP | 0 621 508 A1 | 10/1994 |
| JP | 54-145794 | 11/1979 |
| JP | 3-186847 | 8/1991 |
| JP | 8-50354 | 2/1996 |
| JP | 11-60896 | 3/1999 |
| JP | 2003-215802 | 7/2003 |
| JP | 2004-240143 | 8/2004 |
| JP | 2007-056109 | 3/2007 |
| JP | 2007-065488 | 3/2007 |

\* cited by examiner

*Primary Examiner*—Susan W Berman
(74) *Attorney, Agent, or Firm*—Oblon, Spivak, McClelland, Maier & Neustadt, L.L.P.

(57) ABSTRACT

The objective of the present invention is to provide a photosensitive insulating resin composition which is highly sensitive to g-line and h-line and enables to form a surface-protecting film, an interlayer insulation film and a planarized film that are excellent in various properties including resolution, electrical insulation property and thermal shock resistance, a cured product and an electronic component having the cured product. The present photosensitive insulating resin composition comprises an alkali-soluble resin having a phenolic hydroxyl group, a radiation sensitive acid generator comprising an s-triazine derivative represented by the following general formula (1), and a crosslinking agent.

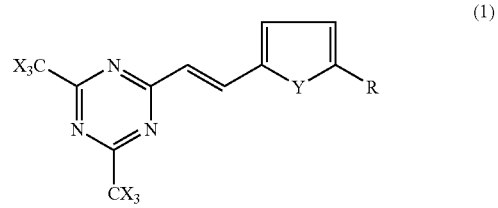

(1)

[In the formula (1), R is hydrogen atom, an alkyl group having 1 to 4 carbon atoms or an alkoxyl group having 1 to 4 carbon atoms, X is a halogen atom and Y is oxygen atom or sulfur atom.]

12 Claims, 2 Drawing Sheets

PHOTOSENSITIVE INSULATING RESIN COMPOSITION, CURED PRODUCT THEREOF AND ELECTRONIC COMPONENT COMPRISING THE SAME

BACKGROUND OF THE INVENTION

1. Field of the Invention

The present invention relates to a photosensitive insulating resin composition which is used for forming a surface-protecting film such as a passivation film and an overcoat film, an interlayer insulation film, a planarized film and the like for semiconductor elements or the like, an insulating cured product formed by curing this composition and an electronic component having this cured product. More specifically, it relates to a cured product that is excellent in resolution and leads to a high residual film ratio in the case of forming a permanent resist and that has excellent properties such as electrical insulation property and thermal shock resistance, a photosensitive insulating resin composition from which such a cured product can be obtained, and an electronic component having the cured product.

2. Description of Related Art

Polyimide-based resins are conventionally known to be excellent in heat resistance and mechanical properties so that they have been widely employed for forming a surface-protecting film, an interlayer insulation film and the like for semiconductor elements in electronic instruments.

Additionally, there have been proposed photosensitive polyimide-based resins having photosensitivity to improve the precision in film formation with accompanying elevation of the integration of semiconductor elements. For example, JP-A S54-145794 and JP-A H03-186847 respectively disclose a composition containing a photosensitive polyimide-based resin wherein a photocrosslinkable group has been incorporated into a polyimide precursor via an ionic bond and a composition containing a photosensitive polyimide-based resin wherein a photocrosslinkable group has been incorporated into a polyimide precursor via an ester bond.

However, these compositions are required to use a solvent for development since a ring closure step is needed for imidation. There is disadvantageous in that resolution is insufficient.

Further, JP-A H08-50354 discloses a negative type photosensitive composition wherein a multifunctional acrylic compound is added to an aromatic polyimide precursor, however, it is pointed out that this composition suffers from similar problems as discussed above.

SUMMARY OF THE INVENTION

An objective of the present invention is to overcome the above-mentioned problems encountering in the prior art and to provide a photosensitive insulating resin composition which is highly sensitive to g-line and h-line and is capable of forming a surface-protecting film, an interlayer insulation film and a planarized film that are excellent in various properties such as resolution, electrical insulation property and thermal shock resistance. Another object of the present invention is to provide a cured product such as an insulation film obtained by curing this photosensitive insulating resin composition and an electronic component having the cured product.

The present inventors conducted intensive studies to overcome the above problems. As a result, a photosensitive insulating resin composition having excellent properties was successfully found.

The present invention is as follows.

1. A photosensitive insulating resin composition comprising [A] an alkali-soluble resin having a phenolic hydroxyl group, [B] a radiation sensitive acid generator comprising an s-triazine derivative represented by the following general formula (1), and [C] a crosslinking agent.

[In the formula (1), R is hydrogen atom, an alkyl group having 1 to 4 carbon atoms or an alkoxyl group having 1 to 4 carbon atoms, X is a halogen atom and Y is oxygen atom or sulfur atom.]

2. The photosensitive insulating resin composition according to 1 above, wherein the crosslinking agent [C] comprises a compound having two or more alkyl-etherified amino groups in its molecule.

3. The photosensitive insulating resin composition according to 2 above, wherein the compound having two or more alkyl-etherified amino groups in its molecule is an alkyl-etherified melamine.

4. The photosensitive insulating resin composition according to 2 above, wherein the crosslinking agent [C] further comprises a compound having an oxirane ring.

5. The photosensitive insulating resin composition according to 4 above, wherein the compound having an oxirane ring is at least one resin among an alicyclic epoxy resin and an aliphatic epoxy resin.

6. The photosensitive insulating resin composition according to 4 above, wherein the compound having two or more alkyl-etherified amino groups in its molecule is an alkyl-etherified melamine.

7. The photosensitive insulating resin composition according to 4 above, wherein content of the compound having an oxirane ring is 50% by weight or less based on 100% by weight of total of the compound having two or more alkyl-etherified amino groups in its molecule and the compound having an oxirane ring.

8. The photosensitive insulating resin composition according to 1 above, wherein the crosslinking agent [C] comprises a compound having an oxirane ring.

9. The photosensitive insulating resin composition according to 8 above, wherein the compound having an oxirane ring is at least one resin among an alicyclic epoxy resin and an aliphatic epoxy resin.

10. The photosensitive insulating resin composition according to 1 above, further comprising [D] a crosslinked fine particle.

11. A cured product wherein the photosensitive insulating resin composition according to 1 above is cured.

12. An electronic component comprising the cured product according to 11 above.

13. The electronic component according to 12 above, wherein the cured product is an interlayer insulation film or a planarized film.

EFFECT OF THE INVENTION

According to the photosensitive insulating resin composition of the present invention, an s-triazine compound having a specific structure is contained as a radiation sensitive acid generator and a wide absorption range including g-line (436 nm), h-line (405 nm) and i-line (365 nm) is observed. Additionally, higher acid generation efficiency can be obtained than commonly employed radiation sensitive acid generators having other triazine skeleton. Thus, the composition can lead a cured product which achieves a high residual film ratio after development and is excellent in various properties such as resolution, electrical insulation property, thermal shock resistance and chemical resistance. Owing to these characteristics, the photosensitive insulating resin composition can be appropriately used for forming a surface-protecting film such as a passivation film and an overcoat film, an interlayer insulation film, a planarized film and the like of an electronic component for semiconductor elements or the like.

DESCRIPTION OF THE PREFERRED EMBODIMENTS

The embodiment modes of the present invention will be described in greater detail.

It is noted that in this specification "(meth)acryl" means acryl and methacryl, "(meth)acrylate" means acrylate and methacrylate, and "(meth)allyl" means allyl and methallyl.

1. Photosensitive Insulating Resin Composition

The photosensitive insulating resin composition of the present invention comprises [A] an alkali soluble resin having a phenolic hydroxyl group, [B] a radiation sensitive acid generator comprising a specific s-triazine derivative, and [C] a crosslinking agent.

1-1. Alkali Soluble Resin Having Phenolic Hydroxyl Group [A]

Examples of "alkali soluble resin having a phenolic hydroxyl group" according to the present invention (hereinafter referred to as "phenol resin [A]") include a novolak resin, polyhydroxystyrene, a polyhydroxystyrene copolymer, a hydroxystyrene-styrene copolymer, a copolymer from hydroxystyrene, styrene and a derivative of (meth)acrylic acid, a phenol-xylylene glycol condensation resin, a cresol-xylylene glycol condensation resin, a phenol-dicyclopentadiene condensation resin and the like. Among these, a novolak resin, polyhydroxystyrene, a polyhydroxystyrene copolymer, a hydroxystyrene-styrene copolymer, a copolymer of hydroxystyrene, styrene and a derivative of (meth)acrylic acid, and a phenol-xylylene glycol condensation resin are preferred. The phenol resin [A] may be used alone or in combination of two or more types thereof.

The novolak resin can be obtained by, for example, condensation of a phenol compound with an aldehyde in the presence of a catalyst.

Examples of the above-mentioned phenol compound include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, β-naphthol and the like.

Examples of the aldehyde include formaldehyde, paraformaldehyde, acetaldehyde, benzaldehyde and the like.

Specific examples of the novolak resin include a phenol-formaldehyde condensation novolak resin, a cresol-formaldehyde condensation novolak resin, a phenol-naphthol-formaldehyde condensation novolak resin and the like.

In addition, the phenol resin [A] may further comprise a low molecular weight phenolic compound as a part of the component thereof.

Examples of the low molecular weight phenolic compound include 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, 1,1,2,2-tetra(4-hydroxyphenyl)ethane, 4,4'-{1-[4-{1-(4-hydroxyphenyl)-1-methylethyl}phenyl]ethylidene}bisphenol and the like. The low molecular weight phenolic compounds may be used alone or in combination of two or more types thereof.

The content of this low molecular weight phenolic compound in the phenol resin [A] is preferably 40% by weight or less and more preferably in the range from 1 to 30% by weight based on 100% by weight of the phenol resin [A].

The weight-average molecular weight of the phenol resin [A] is preferably 2,000 or more and more preferably in the range from about 2,000 to 20,000 from the viewpoints of resolution, thermal shock resistance and heat resistance of the resultant insulating film, and residual film ratio.

The content of the phenol resin [A] in the photosensitive insulating resin composition of the present invention is preferably 30% to 90% by weight and more preferably 40% to 80% by weight based on 100% by weight of the whole composition excluding the solvent. When the content of the phenol resin [A] is in the range from 30% to 90% by weight, a film formed using the photosensitive insulating resin composition of the present invention exhibits sufficient performance in development with an alkaline aqueous solution, being preferable.

1-2. Radiation Sensitive Acid Generator [B]

The "radiation sensitive acid generator" according to the present invention (hereinafter referred to as "acid generator [B]") is a compound which generates an acid upon irradiation with a radiation or the like. The resultant acid has a catalytic function to lead a reaction with a functional group in the corsslinking agent [C] to be described later and a negative pattern can be formed.

The acid generator [B] comprises an s-triazine derivative represented by the following general formula (1). This s-triazine derivative has a wide absorption range including g-line, h-line and i-line and exhibits a higher acid generation efficiency than commonly employed radiation sensitive acid generators having a triazine skeleton. Thus, when this s-triazine derivative is contained, an insulating cured product having a high residual film ratio can be obtained.

(1)

[In the formula (1), R is hydrogen atom, an alkyl group having 1 to 4 carbon atoms or an alkoxyl group having 1 to 4 carbon atoms, X is a halogen atom and Y is oxygen atom or sulfur atom.]

In the case R is an alkyl group having 1 to 4 carbon atoms in the general formula (1) above, examples of the alkyl group methyl group, ethyl group, n-propyl group, isopropyl group, n-butyl group, isobutyl group, sec-butyl group, tert-butyl group and the like. In addition, when R is an alkoxyl group having 1 to 4 carbon atoms, examples include methoxy group, ethoxy group, propoxy group, isopropoxy group, n-butoxy group, isobutoxy group, a sec-butoxy group and the like. Among these groups, R is preferably hydrogen atom or an alkyl group having 1 to 4 carbon atoms. And hydrogen atom, methyl group or ethyl group is more preferable.

In the general formula (1), X representing a halogen atom is preferably fluorine atom, chlorine atom, bromine atom or iodine atom. And chlorine atom is more preferable.

Further, in the above general formula (1), Y represents oxygen atom or sulfur atom. And oxygen atom is more preferable.

Examples of the s-triazine derivative represented by the above general formula (1) include 2-[2-(furan-2-yl)ethenyl]-4,6-bis(trichloromethyl)-s-triazine (Y=O, R=H, X=Cl), 2-[2-(5-methylfuran-2-yl)ethenyl]-4,6-bis(trichloromethyl)-s-triazine (Y=O, R=CH$_3$, X=Cl) and the like.

The s-triazine derivative represented by the above general formula (1) may be used alone or in combination of two or more types thereof.

The content of the above-mentioned acid generator [B] in the photosensitive insulating resin composition of the present invention is preferably in the range of 0.1 to 10 parts by weight, more preferably 0.3 to 8 parts by weight and further preferably 0.5 to 5 parts by weight based on 100 parts by weight of the above-mentioned phenol resin [A] from the viewpoint of securing a higher residual film ratio, sensitivity, resolution, pattern shape and the like. When the content of the acid generator [B] is in the range from 0.1 to 10 parts by weight, a film formed using the photosensitive insulating resin composition of the present invention has a high transparency to radiation and can generate an acid in a sufficient amount for the progress of the curing reaction upon light exposure, thereby giving a favorable pattern shape at a high residual film ratio, being preferable.

In addition to the acid generator [B] as described above, the photosensitive insulating resin composition of the present invention may comprise other acid generator (hereinafter referred to as "other acid generator (b)").

Examples of the other acid generator (b) include an onium salt compound, a halogen-containing compound, a diazoketone compound, a sulfone compound, a sulfonic acid compound, a sulfonimide compound, a diazomethane compound and the like.

Examples of the above-mentioned onium compounds include an iodonium salt, a sulfonium salt, a phosphonium salt, a diazonium salt, a pyridinium salt and the like. Specific examples thereof include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-tert-butylphenyl.diphenylsulfonium trifluoromethanesulfonate, 4-tert-butylphenyl.diphenylsulfonium p-toluenesulfonate, 1-(4,7-dibutoxy-1-naphthalenyl)tetrahydrothiophenium trifluoromethanesulfonate and the like.

Examples of the above-mentioned halogen-containing compound include a haloalkyl group-containing hydrocarbon compound, a haloalkyl group-containing heterocyclic compound and the like. Specific examples thereof include 1,10-dibromo-n-decane, 1,1-bis(4-chlorophenyl)-2,2,2-trichloroethane and an s-triazine derivative such as phenyl-bis(trichloromethyl)-s-triazine, 4-methoxyphenyl-bis(trichloromethyl)-s-triazine, styryl-bis(trichloromethyl)-s-triazine, naphthyl-bis(trichloromethyl)-s-triazine and 2,4-trichloromethyl(piperonyl)-s-trizaine.

Examples of the above-mentioned diazoketone compound include a 1,3-diketo-2-diazo compound, a diazobenzoquinone compound, a diazonaphthoquinone compound and the like. Specific examples thereof include a 1,2-naphthoquinonediazido-4-sulfonic acid ester compound of a phenol compound, and the like.

Examples of the above-mentioned sulfone compound include a β-ketosulfone compound, a β-sulfonylsulfone compound, an α-diazo compound of these compounds, and the like. Specific examples thereof include 4-trisphenacylsulfone, mesitylphenacylsulfone, bis(phenacylsulfonyl)methane and the like.

Examples of the above-mentioned sulfonic acid compound include an alkylsufonic acid ester, a haloalkylsulfonic acid ester, an arylsulfonic acid ester, an iminosulfonate and the like. Specific examples thereof include benzoin tosylate, pyrogallol tristrifluoromethanesulfonate, o-nitrobenzyl trifluoromethanesulfonate, o-nitrobenzyl p-toluenesulfonate and the like.

Examples of the above-mentioned sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicaboxyimide, N-(trifluoromethylsulfonyloxy)naphthylimide and the like.

Examples of the above-mentioned diazomethane compound include bis(trifluoromethylsulfonyl)diazomethane, bis(cyclohexylsulfonyl)diazomethane, bis(phenylsulfonyl) diazomethane and the like.

The other acid generators (b) may be contained singly or in combination of two or more types thereof.

In the case the photosensitive insulating resin composition of the present invention comprises the above-mentioned other acid generator (b), the content thereof is usually 8 parts by weight or less, preferably 5 parts by weight or less and more preferably 3 parts by weight or less based on 100 parts by weight of the above-mentioned phenol resin [A].

1-3. Crosslinking Agent [C]

The "crosslinking agent" according to the present invention (hereinafter referred to as "crosslinking agent [C]") is not particularly restricted so long as it functions as a crosslinkable component (a curing component) reacting with the above-mentioned phenol resin [A]. Examples of the crosslinking agent [C] include a compound having two or more alkyl-etherified amino groups in its molecule, a compound having an oxirane ring, a compound having a thiirane ring, a compound having an oxetanyl group, a compound having an isocyanate group (including a blocked compound), and the like.

Examples of the compound having two or more alkyl-etherified amino groups in its molecule include a compound wherein an active methylol group ($CH_2OH$ groups) of a nitrogen-containing compound such as (poly)methylolated melamine, (poly)methylolated glycoluryl, (poly)methylolated benzoguanamine and (poly)methylolated urea is completely or partially (at least two groups) alkyl-etherified. Examples of the alkyl group constituting the alkyl ether include methyl group, ethyl group, butyl group and the like. These groups may be either the same or different. The above-mentioned compound may be one wherein a methylol group not alkyl-etherified is self-condensed in its molecule. Alternatively, such groups in two molecules may be condensed together to thereby form an oligomer component. The specific examples includes hexa(methoxymethyl)melamine, hexa(butoxymethyl)melamine, tetra(methoxymethyl)glycoluryl, tetra(butoxymethyl)glycoluryl and the like. Among these, an alkyl-etherified melamine such as hexa(methoxymethyl)melamine and hexa(butoxymethyl)melamine is preferred.

The compound having an oxirane ring is not particularly limited so long as it has an oxirane ring in its molecule. Examples thereof include a phenol novolak type epoxy resin, a cresol novolak type epoxy resin, a bisphenol type epoxy resin, a trisphenol type epoxy resin, a tetraphenol type epoxy resin, a phenol-xylylene type epoxy resin, a naphthol-xylylene type epoxy resin, a phenol-naphthol type epoxy resin, a phenol-dicylopentadiene type epoxy resin, an alicyclic epoxy resin, an aliphatic epoxy resin and the like. Among these, an alicyclic epoxy resin and an aliphatic epoxy resin are preferred.

The crosslinking agent [C] may be used alone or in combination of two or more types thereof.

Among these crosslinking agents [C], a compound having two or more alkyl-etherified amino groups in its molecule and a compound having an oxirane ring are preferred. It is more preferable to use the compound having two or more alkyl-etherified amino groups in its molecule together with the compound having an oxirane ring.

The content of the above-mentioned crosslinking agent [C] in the photosensitive insulating resin composition of the present invention is preferably in the range from 1 to 100 parts by weight and more preferably 5 to 50 parts by weight based on 100 parts by weight of the above-mentioned phenol resin [A]. When the content of this crosslinking agent [C] is in the range from 1 to 100 parts by weight, curing reaction proceeds efficiently and the resultant cured product can be obtained which is excellent in resolution. Further the cured product can lead to a favorable pattern shape and be excellent in heat resistance and electrical insulation property.

In the case of using a compound having two or more alkyl-etherified amino groups in its molecule and a compound having an oxirane ring in combination, the content of the compound having an oxirane ring is preferably 50% by weight or less, more preferably 5% to 40% by weight and particularly 5% to 30% by weight based on 100% by weight of the total of the compound having two or more alkyl-etherified amino groups in its molecule and the compound having an oxirane ring. The content as above leads to a cured film having a high chemical resistance without lowering resolution, being preferable.

1-4. Crosslinked Fine Particle

The photosensitive insulating resin composition of the present invention may further contain a crosslinked fine particle (hereinafter referred to as "crosslinked fine particle [D]") for the purpose of improving durability and thermal shock resistance of the resultant cured product.

The crosslinked fine particle [D] is not particularly limited so long as a polymer constituting the crosslinked fine particle has a glass transition temperature ($T_g$) of 0° C. or lower. A preferable polymer is a copolymer of a crosslinkable monomer having two or more unsaturated polymerizable groups (hereinafter, referred to as "crosslinkable monomer") and one or more type of other monomers (hereinafter, referred to as "other monomer") selected so as to give the $T_g$ of the crosslinked fine particles [D] not higher than 0° C. A particularly preferred polymer is one obtained using the crosslinkable monomer and two or more types of the other monomers wherein at least one type of the other monomers has a functional group other than the polymerizable group such as carboxyl group, epoxy group, amino group, isocyanate group and hydroxyl group.

Examples of the crosslinkable monomer include a compound carrying a plural number of polymerizable unsaturated groups such as divinylbenzene, diallyl phthalate, ethylene glycol di(meth)acrylate, propylene glycol di(meth)acrylate, trimethylolpropane tri(meth)acrylate, pentaerythrytol tri(meth)acrylate, polyethylene glycol di(meth)acrylate and polypropylene glycol di(meth)acrylate. Among these, divinylbenzene is preferable.

The amount of the crosslinkable monomer to be used for producing the above-mentioned crosslinked fine particle [D] is preferably in the range from 1% to 20% by weight, more preferably 2% to 10% by weight and particularly 1% to 5% by weight based on 100% by weight of the total amount of all monomers used for the copolymerization.

Examples of the other monomers include a diene compound such as butadiene, isoprene, dimethyl butadiene, chloroprene and 1,3-pentadiene; an unsaturated nitrile compound such as (meth)acrylonitrile, α-chloroacrylonitrile, α-chloromethyl acrylonitrile, α-methoxy acrylonitrile, α-ethoxy acrylonitrile, crotononitrile, cinnamonitrile, itaconodinitrile, maleodinitrile and fumarodinitrile; an unsaturated amide such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonamide and cinnamamide; a (meth)acrylate ester such as methyl(meth)acrylate, ethyl(meth)acrylate, propyl(meth)acrylate, butyl(meth)acrylate, hexyl(meth)acrylate, lauryl(meth)acrylate, polyethylene glycol(meth)acrylate and polypropylene glycol (meth)acrylate; an aromatic vinyl compound such as styrene, α-methylstyrene, o-methoxystyrene, p-hydroxystyrene and p-isopropenylphenol; an epoxy group-containing unsaturated compound such as an epoxy(meth)acrylate obtained by reaction of diglycidyl ether of bisphenol A, diglycidyl ether of glycol or the like with (meth)acrylic acid, a hydroxyalkyl (meth)acrylate or the like, glycidyl(meth)acrylate, and (meth) acryl glycidyl ether; an urethane(meth)acrylate obtained by reaction of a hydroxyalkyl(meth)acrylate with a polyisocyanate; an unsaturated acid compound such as (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate; an amino group-containing unsaturated compound such as dimethylamino(meth)acrylate and diethylamino(meth)acrylate; a hydroxyl group-containing unsaturated compound such as a hydroxyalkyl(meth)acrylate including hydroxyethyl(meth)acrylate, hydroxypropyl(meth)acrylate and hydroxybutyl (meth)acrylate; and the like.

Among these monomers, butadiene, isoprene, (meth)acrylonitrile, an alkyl(meth)acrylate, styrene, p-hydroxystyrene, p-isopropenylphenol, glycidyl(meth)acrylate, (meth)acrylic acid, a hydroxyalkyl(meth)acrylate and the like are preferable.

It is preferable that at least one type of diene compound, specifically butadiene, is used as the other monomer in producing the crosslinked fine particle [D]. The amount of this diene compound to be used is preferably in the range from 20% to 80% by weight, more preferably 30% to 70% by weight and particularly 40% to 70% by weight based on 100% by weight of the total amount of all monomers used for the copolymerization. When the diene compound such as butadiene is used as the other monomer in an amount from 20% to 80% by weight based on 100% by weight of total amount of all monomers for copolymerization, the resultant crosslinked particle [D] may be a rubber-like soft fine particle. Therefore, in the case a cured film is formed, cracking (breakage) can be prevented. And the resultant cured film is excellent in durability.

The crosslinked fine particle [D] may be used alone or in combination of two or more types thereof.

The average particle diameter of the crosslinked fine particle [D] is generally in the range from 30 to 500 nm, preferably 40 to 200 nm and more preferably 50 to 120 nm.

The controlling method for the particle size of the crosslinked fine particle [D] is not particularly limited in preparing, however, when the crosslinked fine particle is synthesized by emulsion polymerization, the particle size can be controlled by adjusting the amount of an emulsifying agent to thereby regulate the number of micells formed during emulsion polymerization.

It is noted that the average particle size of the above-mentioned crosslinked fine particle [D] according to the present invention means the value obtained by the way which a diluted dispersion of the crosslinked fine particle in a conventional manner is subjected to measurement with a light scattering particle-size distribution analyzer "LPA-3000" manufactured by Otsuka Electronics Co., Ltd.

The content of the crosslinked fine particle [D] is preferably 0.5 to 50 parts by weight and more preferably 1 to 30 parts by weight based on 100 parts by weight of the above-mentioned phenol resin [A]. In the case where the content of the crosslinked fine particle [D] is from 0.5 to 50 parts by weight, the crosslinked fine particle [D] is excellent in miscibility with other components and dispersibility in the composition, and thermal shock resistance and heat resistance of the resultant cured film can be improved.

1-5. Adhesion Auxiliary

The photosensitive insulating resin composition of the present invention may further contain an adhesion auxiliary (hereinafter referred to as "adhesion auxiliary [E]") for the purpose of improving adhesion to the base material.

Examples of the adhesion auxiliary include a functional silane coupling agent having a reactive substituent such as carboxyl group, methacryloyl group, isocyanate group and epoxy group, and the like. Specific examples thereof include γ-trimethoxysilyl benzoic acid, γ-methacryloxypropyl trimethoxysilane, vinyltriacetoxysilane, vinyltrimethoxysilane, γ-isocyanatopropyl triethoxysilane, γ-glycidoxypropyltrimethoxysilane, β-(3,4-epoxycyclohexyl)ethyl trimethoxysilane, 1,3,5-N-tris(trimethoxysilylpropyl)isocyanulate and the like. The adhesion auxiliary [E] may be used alone or in combination of two or more types thereof.

The content of the above-mentioned adhesion auxiliary [E] is preferably in the range from 0.2 to 10 parts by weight and more preferably 0.5 to 8 parts by weight based on 100 parts by weight of the above-mentioned phenol resin [A]. In the case where the content of the adhesion auxiliary [E] is from 0.2 to 10 parts by weight, the obtained composition is excellent in storage stability and shows favorable adhesion.

1-6. Solvent

The photosensitive insulating resin composition of the present invention may further contain a solvent (hereinafter referred to as "solvent [F]") to improve the handling properties of the resin composition and control the viscosity and storage stability thereof.

The solvent [F] is not particularly limited, however, examples include an ethylene glycol monoalkyl ether acetate such as ethylene glycol monomethyl ether acetate and ethylene glycol monoethyl ether acetate; a propylene glycol monoalkyl ether such as propylene glycol monomethyl ether, propylene glycol monoethyl ether, propylene glycol monopropyl ether and propylene glycol monobutyl ether; a propylene glycol dialkyl ether such as propylene glycol dimethyl ether, propylene glycol diethyl ether, propylene glycol dipropyl ether and propylene glycol dibutyl ether; a propylene glycol monoalkyl ether acetate such as propylene glycol monomethyl ether acetate, propylene glycol monoethyl ether acetate, propylene glycol monopropyl ether acetate and propylene glycol monobutyl ether acetate; a cellosolve such as ethyl cellosolve and butyl cellosolve; a carbitol such as butyl carbitol; a lactate such as methyl lactate, ethyl lactate, n-propyl lactate and isopropyl lactate; an aliphatic carboxylate such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate; other esters such as methyl 3-methoxypropionate, ethyl 3-methoxypropionate, methyl 3-ethoxypropionate, ethyl 3-ethoxypropionate, methylpyruvate and ethyl pyruvate; an aromatic hydrocarbon such as toluene and xylene; a ketone such as 2-heptanone, 3-heptanone, 4-heptanone and cyclohexanone; an amide such as N-dimethylformamide, N-methylacetamide, N,N-dimethylacetamide and N-methylpyrrolidone; and a lactone such as γ-butyrolactone. These solvents may be used alone or in combination of two or more.

1-7. Other Additive

The photosensitive insulating resin composition of the present invention may also contain other additives (hereinafter referred to as "other additive [G]"), so long as characteristics according to the invention are not damaged thereby. Examples of the other additive [G] include inorganic filler, a sensitizing agent, a quencher, a leveling agent-surface activating agent and the like.

The above-mentioned leveling agent-surface activating agent is usually incorporated for the purpose of improving coating performance of the resin composition. This leveling agent-surface activating agent is not particularly limited. The preferred is a nonion-based agent and examples thereof include a polyoxyethylene alkyl ether such as polyoxyethylene lauryl ether, polyoxyethylene stearyl ether, polyoxyethylene cetyl ether and polyoxyethylene oreyl ether; a polyoxyethylene alkyl allyl ether such as polyoxyethylene octylphenol ether and polyoxyethylene nonylphenol ether; a polyoxyethylene polyoxypropylene block copolymer; a sorbitan fatty acid ester such as sorbitan monolaurate, sorbitan monopalmitate and sorbitan monostearate; a polyoxyethylene sorbitan fatty acid ester such as polyoxyetheylene sorbitan monolaurate, polyoxyetheylene sorbitan monopalmitate, polyoxyetheylene sorbitan monostearate, polyoxyetheylene sorbitan trioleate and polyoxyetheylene sorbitan tristearate; and the like.

Examples of commercial products include a fluorine-based leveling agent-surface activating agent such as "Eftop EF301", "Eftop EF303" and "Eftop EF352" manufactured by Tochem Products Corp., "Megafak F171", "Megafak F172" and "Megafak F173" manufactured by Dainippon ink and chemicals Inc., "Fluorad FC430" and "Fluorad FC431" manufactured by Sumitomo 3M Ltd., "Asahiguard AG710", "Surfron S-381", "Surfron S-382", "Surfron SC101", "Surfron SC102", "Surfron SC103", "Surfron SC104", "Surfron SC105", "Surfron SC106", "Surfynol E1004", "KH-10", "KH-20", "KH-30" and "KH-40" manufactured by Asahi glass Co., Ltd., and "Ftergent 250", "Ftergent 251", "Ftergent 222F" and "FTX-218" manufactured by NEOS COMPANY LIMITED; an organosiloxane polymer such as "KP341", "X-70-092" and "X-70-093" manufactured by Shin-etsu Chemical Co., Ltd., "SH8400" manufactured by Dow Corning Toray Co., Ltd.; an acrylic or an methacrylic leveling agent such as "POLYFLOW No. 75", "POLYFLOW No. 77", "POLYFLOW No. 90" and "POLYFLOW No. 95" manufactured by Kyoeisha Chemical Co., Ltd.; and the like. The leveling agent-surface activating agent may be used alone or in combination of two or more types thereof.

The content of the above-mentioned leveling agent-surface activating agent in a resin solution is preferably in the 50 to 1,000 ppm and more preferably 100 to 800 ppm. In the case where the content of this leveling agent-surface activating agent is from 50 to 1,000 ppm, the resin composition can be applied uniformly onto a stepped base material and adhesion during development and after curing is excellent, being favorable.

1-8. Preparation Method

The method of preparing the photosensitive insulating resin composition of the present invention is not particularly limited. Namely, the above-mentioned components are used and produced by publicly known methods. It is also possible to prepare the composition by stirring the contents in the state where a bottle containing starting components is on a wave rotor while sealing tightly with a plug.

2. Cured Product

The cured product of the present invention is characterized in that the above-described photosensitive insulating resin composition is cured.

The above-described photosensitive insulating resin composition according to the present invention has a high residual film ratio and an excellent resolution. Therefore, a cured product thereof is excellent in electrical insulation property and thermal shock resistance. The cured product of the present invention is suitably used, in particular, as a surface-protecting film, a planarized film, an interlayer insulation and the like for an electronic component such as semiconductor elements and semiconductor packages.

The cured product of the present invention is prepared as follows. First, the above-described photosensitive insulating resin composition of the present invention is coated on a base material such as a resin-coated copper foil, a copper clad laminate, and a silicon wafer and alumina plate each having a sputtered metal film, and the coating is subjected to drying to evaporate a solvent and the like, thereby forming a resin film. After that, the resin film is exposed to light through a mask having a desired pattern and heated (hereinafter, referred to "PEB") to thereby promote the reaction between the phenol resin [A] and the crosslinking agent [C]. Subsequently, development is conducted using an alkaline developer and the unexposed part is dissolved to remove. Thus a desired pattern can be obtained. And then, heating is further conducted to obtain a cured film for the purpose of expressing the insulating film characteristics.

Examples of the method of coating the resin composition on the base material include dipping method, spraying method, bar coating method, roll coating method, spin coating method and the like. In addition, the thickness of the coating film may be controlled by selecting the coating method and the solid content or viscosity of the composition.

Examples of radiation to be used for exposure include ultraviolet light emitted from a low-pressure mercury lamp, a high-pressure mercury lamp, a metal halide lamp, a g-line stepper, an h-line stepper, an i-line stepper, a gh-line stepper and a ghi-line stepper, electron beam, laser beam and the like. The exposure dose may be appropriately determined depending on the radiation source used, the thickness of the resin film and the like. In the case where a resin film having a thickness of 1 to 50 μm is radiated with ultraviolet light emitted from a high-pressure mercury lamp, for example, the exposure dose is usually in the range from 100 to about 20,000 $J/m^2$.

After the completion of the exposure, the PEB is conducted to promote a curing reaction between the phenol resin [A] and the crosslinking agent [C] by an acid generated. The conditions for the PEB vary depending on a composition of contained components in the resin composition such as formulated amounts, a film thickness and the like. In usual, the PEB treatment is conducted at a temperature in the range from 70° C. to 150° C. and preferably from 80° C. to 120° C., for about 1 to 60 minutes. Subsequently, the film is developed with an alkaline developer and the non-exposed part is dissolved to remove. Thus a desired pattern is formed. Examples of the developing method include shower development method, spray development method, immersion development method, puddle development method and the like. The development is usually conducted at a temperature in the range from 20° C. to 40° C., for about 1 to 10 minutes.

Examples of the alkaline developer include an alkaline aqueous solution prepared by dissolving an alkaline compound such as sodium hydroxide, potassium hydroxide, ammonia water, tetramethyl ammonium hydroxide and choline in water so as to have the concentration of the above-mentioned alkaline compound of about 1% to 10% by weight. The alkaline aqueous solution may further contain an appropriate amount of a water-soluble organic solvent such as methanol and ethanol, a surfactant and the like. After developing with the alkaline developer, water washing and drying are usually carried out.

In order to give the characteristics as an insulating film, the film is heated to sufficiently cur after development. The conditions for curing are not particularly limited and are selected depending on the purpose of the use of the cured product. For example, the film is heated at a temperature in the range from 50° C. to 250° C., for 30 minutes to 10 hours to cure. Furthermore, it is also possible to carry out the heat treatment in two stages so as to allow a sufficient curing progress and to avoid deformation of the obtained pattern shape. For example, at the first step, the heat treatment may be carried out at a temperature in the range from 50° C. to 120° C., for 5 minutes to 2 hours, and at the second step of heating at 80° C. to 250° C., for 10 minutes to 10 hours for curing. Under these conditions, the heat treatment may be conducted with an oven, an infrared oven and the like commonly employed as a heating apparatus in the art.

Figure 1:
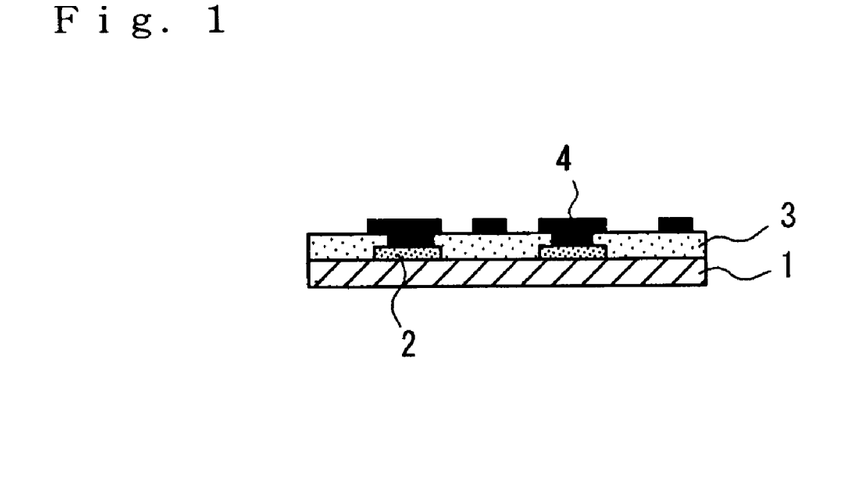
FIG. 1 is a cross-sectional view showing a semiconductor element.
Figure 2:
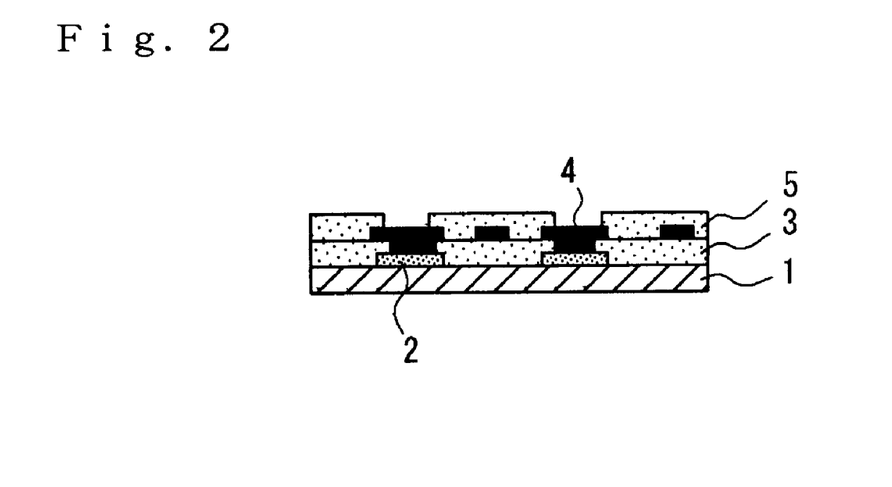
FIG. 2 is a cross-sectional view showing a semiconductor element.

Use of the photosensitive insulating resin composition according to the present invention leads to an electronic component such as semiconductor devices (circuit board) shown in FIGS. 1 and 2, and the like. That is to say, the electronic component of the present invention comprises the above-mentioned cured product. The circuit board as shown in FIG. 1 can be manufactured by imparting a specific pattern to a metal pad 2 on a substrate 1, imparting a specific pattern to a cured insulation film 3 with the use of the above-mentioned resin composition, and then imparting a specific pattern to a metal wiring 4. Additionally, the circuit board as shown in FIG. 2 can be manufactured by further forming a cured insulation film 5 on the circuit board of FIG. 1 with the use of the above-mentioned resin composition.

EXAMPLES

Hereinafter, the present invention will be described in greater detail by referring to the following Examples. The present invention is in no way limited by these Examples.

1. Preparation of Photosensitive Insulating Resin Composition

Example 1

A photosensitive insulating resin composition was prepared by dissolving 100 parts by weight of a phenol resin (A-1), 1.0 part by weight of a radiation sensitive acid generator (B-1), 25 parts by weight of a crosslinking agent (C-4) and 5 parts by weight of an adhesion auxiliary (E-1) in 145 parts by weight of a solvent (F-1) according to the formulation shown in Table 1.

Examples 2 to 7 and Comparative Examples 1 and 2

Photosensitive insulating resin compositions were prepared by dissolving a phenol resin, a radiation sensitive acid generator, a radiation sensitive acid generator, a crosslinking agent and an adhesion auxiliary in a solvent according to the formulation shown in Table 1 in the same manner as in Example 1.

The components listed in Table 1 are as follows. It is noted that the crosslinked fine particle [D] are ones prepared by methods below.

(1) Phenol Resin [A]

A-1: copolymer of p-hydroxystyrene, styrene and vinylbenzoic acid (molar ratio of 18:80:2), having a weight average molecular weight (Mw) in terms of polystyrene of 10,000

A-2: copolymer of p-hydroxystyrene and styrene (molar ratio of 80:20), Mw; 10,000

A-3: polyhydroxystyrene, Mw; 10,000

A-4: p-xylylene glycol condensation phenol resin (trade name "XLC-3L" manufactured by Mitsui Chemicals Inc.)

A-5: cresol-novolak resin made by m-cresol and p-cresol (molar ratio of 60:40), Mw; 6,500

A-6: 4,4'-{1-[4-[2-(4-hydroxyphenyl)-2-propyl]phenyl]ethylidene}bisphenol (as low molecular weight phenolic compound)

(2) Acid Generator [B]

B-1: 2-[2-(furan-2-yl)ethenyl]-4,6-bis(trichloromethyl)-s-triazine (trade name "TFE-triazine" manufactured by Sanwa Chemical Co., Ltd.)

B-2: 2-[2-(5-methylfuran-2-yl)ethenyl]-4,6-bis(trichloromethyl)-s-triazine (trade name "TME-triazine" manufactured by Sanwa Chemical Co., Ltd.)

(3) Other Acid Generator (b)

b-1: 2,4-trichloromethyl(piperonyl)-s-triazine;

b-2: 1-(4,7-dibutoxy-1-naphthalenyl)tetrahydrothiophenium trifluoromethanesulfonate (4) Crosslinking Agent [C]

C-1: novolak type epoxy resin (trade name "EP-152" manufactured by Japan Epoxy Resins Co., Ltd.)

C-2: bisphenol A type epoxy resin (trade name "EPICOAT 828" manufactured by Japan Epoxy Resins Co., Ltd.)

C-3: trimethylolpropane polyglycidyl ether (trade name "EPOLIGHT 100MF" manufactured by Kyoeisha Chemical Co., Ltd.)

C-4: hexa(methoxymethyl)melamine (trade name "NIKALAC MW-390" manufactured by Sanwa Chemical Co., Ltd.)

TABLE 1

| | Phenol resin [A] | | Acid generator [B] | | Crosslinking agent [C] | | Crosslinked fine particle [D] | | Adhesion auxiliary [E] | | Solvent [F] | | Other additives [G] | |
|---|---|---|---|---|---|---|---|---|---|---|---|---|---|---|
| | Type | Part | Type | Part | Type | Part | Type | Part | Type | Part | Type | Part | Type | Part |
| Example 1 | A-1 | 100 | B-1 | 1.0 | C-4 | 25 | — | — | E-1 | 5 | F-1 | 145 | — | — |
| Example 2 | A-2 | 100 | B-2 | 1.0 | C-4 | 20 | D-1 | 10 | E-2 | 5 | F-1 | 145 | — | — |
| Example 3 | A-3 | 100 | B-1 | 0.8 | C-1 | 10 | D-2 | 5 | E-1 | 5 | F-2 | 145 | — | — |
| | | | b-1 | 0.2 | C-4 | 15 | | | | | | | | |
| Example 4 | A-4 | 30 | B-2 | 0.8 | C-3 | 10 | D-2 | 10 | E-1 | 5 | F-1 | 80 | — | — |
| | A-5 | 70 | b-2 | 0.2 | C-4 | 20 | | | | | F-2 | 65 | | |
| Example 5 | A-5 | 100 | B-2 | 0.8 | C-2 | 5 | — | — | E-1 | 5 | F-1 | 145 | — | — |
| | | | | | C-4 | 20 | | | | | | | | |
| Example 6 | A-3 | 20 | B-2 | 1.0 | C-3 | 5 | D-1 | 5 | E-1 | 2.5 | F-1 | 72 | G-1 | 0.1 |
| | A-5 | 70 | | | C-4 | 15 | | | | | F-2 | 48 | | |
| | A-6 | 10 | | | | | | | | | | | | |
| Example 7 | A-3 | 20 | B-2 | 1.0 | C-3 | 5 | D-2 | 5 | E-1 | 2.5 | F-1 | 72 | G-2 | 0.1 |
| | A-5 | 70 | | | C-4 | 15 | | | | | F-2 | 48 | | |
| | A-6 | 10 | | | | | | | | | | | | |
| Comparative Example 1 | A-1 | 100 | b-1 | 1.0 | C-4 | 25 | — | — | E-1 | 5 | F-1 | 145 | — | — |
| Comparative Example 2 | A-2 | 100 | b-2 | 1.0 | C-1 | 5 | D-2 | 10 | E-1 | 5 | F-1 | 145 | — | — |
| | | | | | C-4 | 20 | | | | | | | | |

(5) Crosslinked Fine Particle [D]

D-1: copolymer of butadiene, acrylonitrile, hydroxybutyl methacrylate, methacrylic acid and divinylbenzene (weight ratio of 64:20:8:6:2), average particle diameter; 65 nm, Tg; −38° C.

D-2: copolymer of butadiene, styrene, hydroxybutyl methacrylate, methacrylic acid and divinylbenzene (weight ratio of 48:20:24:6:2), average particle diameter; 65 nm, Tg; −9° C.

The average particle diameter was measured with diluted latex after polymerization using a particle size distribution analyzer "UPA-EX150" manufactured by Nikkiso Co., Ltd. And the glass transition temperature was measured using a DSC.

(6) Adhesion Auxiliary [E]

E-1: γ-glycidoxypropyltrimethoxysilane (trade name "S510" manufactured by Chisso Corp.)

E-2: 1,3,5-N-tris(trimethoxysilylpropyl)isocyanurate (trade name "Y-11597" manufactured by GE Toshiba Silicones Co., Ltd.)

(7) Solvent [F]

F-1: ethyl lactate
F-2: 2-heptanone (8) Other Additive [G]

G-1: leveling agent-surfactant (trade name "FTX-218" manufactured by NEOS COMPANY LIMITED)

G-2: leveling agent-surfactant (trade name "POLYFLOW No. 90" manufactured by Kyoeisha Chemical Co., Ltd.)

[Preparation Process for the Crosslinked Fine Particle (D-1)]

Monomers consisting of 64% by weight of butadiene, 20% by weight of acrylonitrile, 8% by weight of hydroxybutyl methacrylate, 6% by weight of methacrylic acid and 2% by weight of divinylbenzene were subjected to emulsion polymerization at 15° C. according to the following recipe in an autoclave. Subsequently, 0.3 part by weight of N,N-diethylhydroxylamine as a reaction terminator was added to obtain a copolymeric emulsion. After that, steam was introduced into this polymer solution to eliminate unreacted monomers and this solution was added to a 5% calcium chloride aqueous solution to solidify a copolymer. The copolymer was rinsed with water and dried in a blast dryer set at 90° C. for two hours to obtain a crosslinked fine particle (D-1).

<Polymerization Recipe>

Monomers (100 parts by weight), distilled water (220 parts by weight), sodium dodecylbenzenesulfonate (3 parts by weight), potassium chloride (0.04 part by weight), ethylenediamine tetraacetic acid sodium salt (0.09 part by weight), hydrosulfite (0.05 part by weight), iron (II) sulfate (0.016 part by weight), sodium formaldehyde-sulfoxylate (0.05 part by weight), and para menthane hydroperoxide (0.05 part by weight).

[Preparation Process for the Crosslinked Fine Particle (D-2)]

Crosslinked fine particle (D-2) was isolated in the same manner as the case of the above-mentioned crosslinked fine particle (D-1) except that monomers consisting of 48% by weight of butadiene, 20% by weight of styrene, 24% by weight of hydroxybutyl methacrylate, 6% by weight of methacrylic acid and 2% by weight of divinylbenzene were used.

2. Evaluation of Photosensitive Insulating Resin Composition

The properties of photosensitive insulating resin compositions obtained in Examples 1 to 7 and Comparative Examples 1 and 2 were evaluated in accordance with the following methods. Results are shown in Table 2.

(1) Residual Film Ratio

A 6-inch silicon wafer was spin-coated with a photosensitive insulating resin composition and heated at 110° C. for 3 minutes on a hot plate to obtain a uniform resin film of 20 μm in thickness. After that, the resin film was irradiated with ultraviolet light from a high-pressure mercury lamp through a patterned mask so that the exposure dose at a wavelength of 420 nm was kept at 500 mJ/cm$^2$ using an aligner "MA-150" manufactured by Karl Suss. Subsequently, it was heated at 110° C. for 3 minutes on a hot plate (PEB) and then developed by immersing in an aqueous solution containing 2.38% by weight of tetramethyl ammonium hydroxide at 23° C. for 120 seconds. The residual film ratio was calculated from the film thickness before and after the development.

(2) Resolution

A 6-inch silicon wafer was spin-coated with a photosensitive insulating resin composition and heated at 110° C. for 3 minutes on a hot plate to obtain a uniform resin film of 20 μm in thickness. After that, the resin film was irradiated with ultraviolet light from a high-pressure mercury lamp through a patterned mask so that the exposure dose at a wavelength of 420 nm was kept at 500 mJ/cm$^2$ using an aligner "MA-150" manufactured by Karl Suss. Subsequently, it was heated at 110° C. for 3 minutes on a hot plate (PEB) and then developed by immersing in an aqueous solution containing 2.38% by weight of tetramethyl ammonium hydroxide at 23° C. for 120 seconds. The minimum width of the formed pattern was measured and it was taken as the resolution.

(3) Adhesion

A $SiO_2$-sputtered silicon wafer was coated with a photosensitive insulating resin composition and heated at 110° C. for 3 minutes on a hot plate to obtain a uniform resin film of 10 μm in thickness. After that, the resin film was irradiated with ultraviolet light from a high-pressure mercury lamp through a patterned mask so that the exposure dose at a wavelength of 420 nm was kept at 500 mJ/cm$^2$ using an aligner "MA-150" manufactured by Karl Suss. Subsequently, it was heated at 110° C. for 3 minutes on a hot plate (PEB) and heated at 190° C. for 1 hour in a convection oven to cure the resin film to a cured film. Then the resultant wafer having a cured film was subjected to treatment in a condition at a temperature of 121° C. and a humidity of 100% under a pressure of 2.1 atm for 168 hours with a pressure cooker test machine "EHS-221MD" manufactured by ESPEC Corp. The adhesion of the cured film was evaluated by the cross-cut test (grid tape method) in accordance with JIS K 5400 before and after the test.

(4) Thermal Shock Resistance

Figure 3:
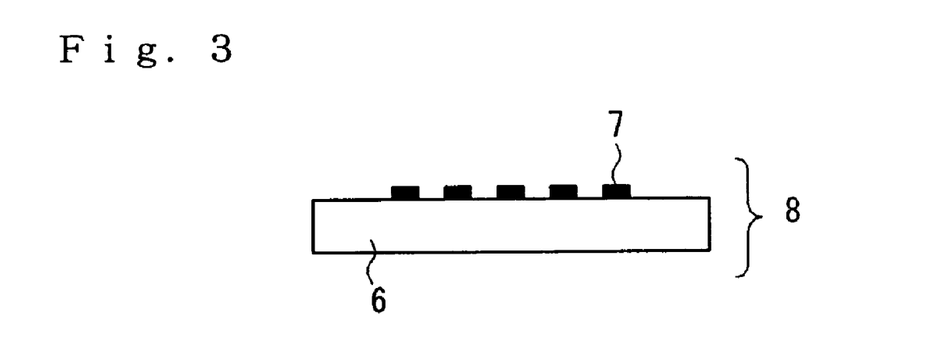
FIG. 3 is a cross-sectional view showing a base material for evaluating thermal shock resistance.
Figure 4:
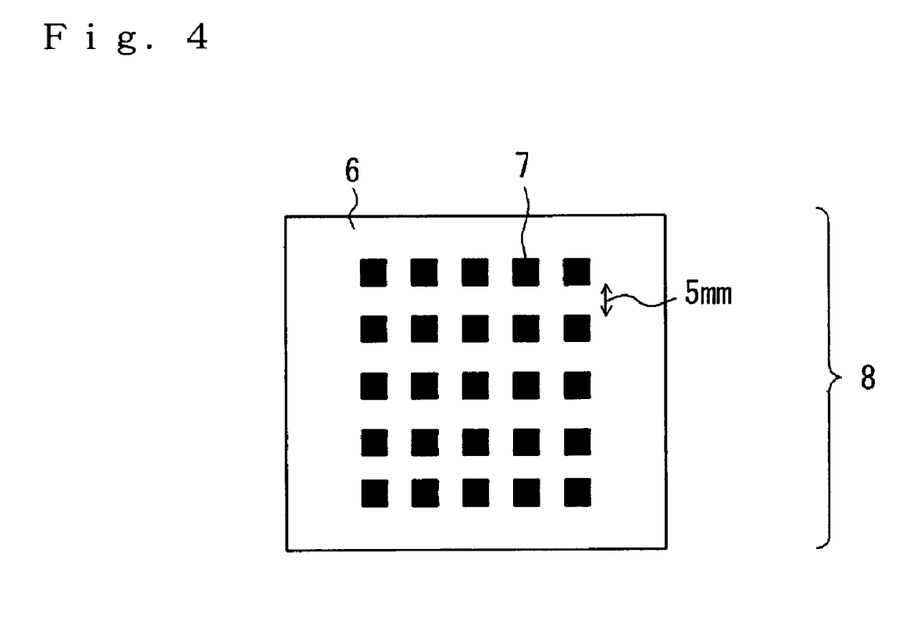
FIG. 4 is a schematic view showing a base material for evaluating thermal shock resistance.

A base material 8 for evaluating thermal shock resistance, which had a copper layer 7 having a specific pattern on a substrate 6 as shown in FIGS. 3 and 4, was coated with a photosensitive insulating resin composition and heated at 110° C. for 3 minutes on a hot plate to prepare base material having a resin film of 10 μm in thickness on the copper layer 7. After that, the resin film was irradiated with ultraviolet light from a high-pressure mercury lamp through a patterned mask so that the exposure dose at a wavelength of 420 nm was kept at 500 mJ/cm$^2$ using an aligner "MA-150" manufactured by Karl Suss. Subsequently, it was heated at 110° C. for 3 minutes on a hot plate (PEB) and heated at 190° C. for 1 hour in a convection oven to cure the resin film to a cured film. The resultant base material having a cured film was subjected to tolerance test using a thermal shock test machine "TSA-40L" manufactured by ESPEC Corp. with each cycle consisting of 30 minutes at −65° C. and 30 minutes at 150° C. The number of cycles (at every 100 cycles) until any defects such as cracks arose in the cured film was measured.

(5) Electrical Insulation Property

Figure 5:
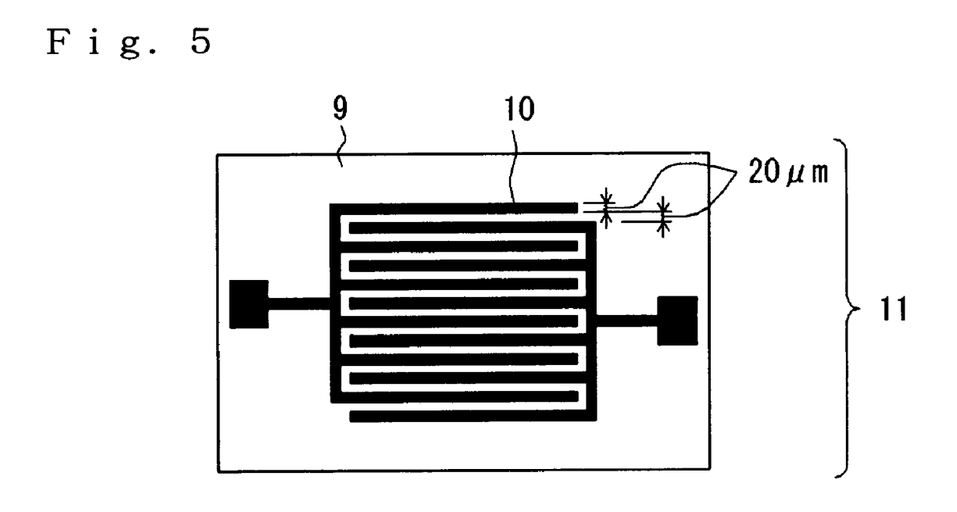
FIG. 5 is a schematic view showing a base material for evaluating electrical insulation property.

A base material 11 for evaluating electrical insulation property, which had a copper layer 10 having a specific pattern on a substrate 9 as shown in FIG. 5, was coated with a photosensitive insulating resin composition and heated at 110° C. for 3 minutes on a hot plate to prepare base material having a resin film of 10 μm in thickness on the copper layer 10. After that, the resin film was irradiated with ultraviolet light from a high-pressure mercury lamp through a patterned mask so that the exposure dose at a wavelength of 420 nm was kept at 500 mJ/cm² using an aligner "MA-150" manufactured by Karl Suss. Subsequently, it was heated at 110° C. for 3 minutes on a hot plate (PEB) and heated at 190° C. for 1 hour in a convection oven to cur the resin film to a cured film. The resultant base material having a cured film was put into a migration evaluation system "AEI EHS-221MD" manufactured by ESPEC Corp. and subjected to treatment in a condition at a temperature of 121° C. and a humidity of 85% under a pressure of 1.2 atm at an applied voltage of 5 V for 200 hours. Then the resistance (Ω) of the cured film of the test base material was measured to thereby evaluate the electrical insulation property.

TABLE 2

| | Evaluation | | | | |
|---|---|---|---|---|---|
| | Residual film ratio (%) | Reso- lution (μm) | Adhesiveness | | Thermal shock resistance (cycle) | Insulating property (Ω) |
| | | | Before test | After test | | |
| Example 1 | 98 | 10 | 100/100 | 100/100 | 2,000 | $1 \times 10^{12}$ |
| Example 2 | 98 | 20 | 100/100 | 100/100 | 2,200 | $1 \times 10^{12}$ |
| Example 3 | 97 | 20 | 100/100 | 100/100 | 2,200 | $1 \times 10^{12}$ |
| Example 4 | 97 | 20 | 100/100 | 100/100 | 2,000 | $1 \times 10^{12}$ |
| Example 5 | 96 | 20 | 100/100 | 100/100 | 2,000 | $1 \times 10^{12}$ |
| Example 6 | 98 | 10 | 100/100 | 100/100 | 2,000 | $1 \times 10^{12}$ |
| Example 7 | 98 | 10 | 100/100 | 100/100 | 2,000 | $1 \times 10^{12}$ |
| Comparative Example 1 | 89 | 20 | 100/100 | 100/100 | 2,000 | $1 \times 10^{12}$ |
| Comparative Example 2 | 89 | 20 | 100/100 | 100/100 | 2,000 | $1 \times 10^{12}$ |

What is claimed is:

1. A photosensitive insulating resin composition, comprising
   [A] an alkali-soluble resin having a phenolic hydroxyl group,
   [B] a radiation sensitive acid generator comprising an s-triazine derivative represented by the following general formula (1), and
   [C] a crosslinking agent, (1)

wherein said crosslinking agent [C] comprises a novolak type epoxy resin and an alkyl-etherified melamine, and
wherein, in the formula (1),
R is hydrogen atom, an alkyl group having 1 to 4 carbon atoms or an alkoxyl group having 1 to 4 carbon atoms,
X is a halogen atom, and
Y is oxygen atom or sulfur atom.

2. The photosensitive insulating resin composition according to claim 1, wherein a content of said novolak type epoxy resin is 50% by weight or less based on 100% by weight of a total of said novolak type epoxy resin and said alkyl-etherified melamine.

3. The photosensitive insulating resin composition according to claim 1, further comprising [D] a crosslinked fine particle.

4. A cured product wherein said photosensitive insulating resin composition according to claim 1 is cured.

5. An electronic component comprising said cured product according to claim 4.

6. The electronic component according to claim 5, wherein said cured product is an interlayer insulation film or a planarized film.

7. A photosensitive insulating resin composition, comprising
   [A] an alkali-soluble resin having a phenolic hydroxyl group,
   [B] a radiation sensitive acid generator comprising an s-triazine derivative represented by the following general formula (1), and
   [C] a crosslinking agent, (1)

wherein said crosslinking agent [C] comprises trimethylolpropane polyglycidyl ether and an alkyl-etherified melamine, and
wherein, in the formula (1),
R is hydrogen atom, an alkyl group having 1 to 4 carbon atoms or an alkoxyl group having 1 to 4 carbon atoms,
X is a halogen atom, and
Y is oxygen atom or sulfur atom.

8. The photosensitive insulating resin composition according to claim 7, wherein a content of said trimethylolpropane polyglycidyl ether is 50% by weight or less based on 100% by weight of a total of said trimethylolpropane polyglycidyl ether and said alkyl-etherified melamine.

9. The photosensitive insulating resin composition according to claim 7, further comprising [D] a crosslinked fine particle.

10. A cured product wherein said photosensitive insulating resin composition according to claim 7 is cured.

11. An electronic component comprising said cured product according to claim 10.

12. The electronic component according to claim 11, wherein said cured product is an interlayer insulation film or a planarized film.

* * * * *